United States Patent
Han (10) Patent No.: US 10,101,781 B2
(45) Date of Patent: Oct. 16, 2018

(54) SYSTEM AND METHOD FOR CONTROLLING TEMPERATURES OF COMPUTER

(71) Applicants: Inventec (Pudong) Technology Corporation, Shanghai (CN); INVENTEC CORPORATION, Taipei (TW)

(72) Inventor: Ying-Xian Han, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 315 days.

(21) Appl. No.: 15/078,520

(22) Filed: Mar. 23, 2016

(65) Prior Publication Data

US 2017/0160774 A1   Jun. 8, 2017

(30) Foreign Application Priority Data

Dec. 3, 2015   (CN) .......................... 2015 1 0883087

(51) Int. Cl.
   *G06F 1/20*   (2006.01)
   *G05B 15/02*   (2006.01)
   *H05K 7/20*   (2006.01)

(52) U.S. Cl.
   CPC ............. *G06F 1/206* (2013.01); *G05B 15/02* (2013.01); *H05K 7/20209* (2013.01)

(58) Field of Classification Search
   CPC ...... G06F 1/206; G05B 15/02; H05K 7/20209
   USPC ....................................................... 700/282
   See application file for complete search history.

(56) References Cited

U.S. PATENT DOCUMENTS

| 2004/0070932 | A1 | 4/2004 | Dobbs et al. |
| 2006/0259685 | A1* | 11/2006 | Makino ................ G11B 33/125 711/114 |
| 2010/0281884 | A1* | 11/2010 | Rawski .................. F25B 21/04 62/3.6 |
| 2014/0298055 | A1* | 10/2014 | Zhou ..................... G06F 1/3231 713/320 |
| 2015/0019711 | A1* | 1/2015 | Zhang ................ H04L 43/0817 709/224 |

(Continued)

FOREIGN PATENT DOCUMENTS

| CN | 204808335 U | 11/2015 |
| JP | 2012048653 A | 3/2012 |

(Continued)

*Primary Examiner* — Robert A Cassity
(74) *Attorney, Agent, or Firm* — Muncy, Geissler, Olds & Lowe, P.C.

(57) ABSTRACT

In a system and a method for controlling temperatures of a computer, an infrared induction module and a temperature-detecting module are applied to obtain position information and temperature information of a device module, and the position information and the temperature information are further analyzed and judged by a baseboard management controller to carry out different control means for the device module under different operation status and temperature conditions. Through the system and the method, the device module can be kept in operating under an operation temperature less than a predetermined temperature, so as to ensure the normal operation of the device module and to further promote the efficiency of test, maintenance and repair.

16 Claims, 5 Drawing Sheets

(56) References Cited

U.S. PATENT DOCUMENTS

2016/0037686 A1\* 2/2016 Shabbir .................. G06F 1/206
                                                                        700/300

FOREIGN PATENT DOCUMENTS

| TW | I225991 B   | 1/2005 |
|----|-------------|--------|
| TW | 200925839 A | 6/2009 |
| TW | 201517032 A | 5/2015 |

\* cited by examiner

SYSTEM AND METHOD FOR CONTROLLING TEMPERATURES OF COMPUTER

BACKGROUND

1. Field of the Invention

The invention relates to a design technology of servers, and more particularly to a system and a method for controlling temperatures of a computer.

2. Description of the Prior Art

Currently, it is one of many demands that requires a chassis of a server to accommodate versatile combinations of device modules so as to increase capacity in storage and management of the server. These device modules connecting with the same mother board of the server are usually mounted into the chassis in a draw-able manner. Namely, each of the device modules is slippery pushed into or pulled away the chassis in a manner similar to a conventional drawer. Heat dissipation for these device modules is mainly carried out by a heat-dissipating fan to provide a lateral airflow to each of the device modules via corresponding ventilation piping. However, in the case that a specific device module is pulled out of the chassis for testing or maintenance, then the heat-dissipating fan would be distant from this device module, and thus the efficiency of heat dissipation upon the pulled-away device module by the heat-dissipating fan would be significantly reduced. At this time, if the device module is way out of the chassis too long, an over-heated situation would occur in this pulled-away device module. As a consequence, the testing and maintenance, even the personal in charge, would be influenced.

SUMMARY

Accordingly, it is the primary object of the present invention to provide a system and a method for controlling temperatures of a computer that would base on position information and temperature information of individual device modules to adjust in-timely controls upon temperatures of the device modules. Thereby, normal operation temperatures of the device modules can be ensured, and the efficiency of test, maintenance and repair would be greatly increased.

In the present invention, the system for controlling temperatures of a computer includes a chassis further including thereinside a mother board, a first device module, an infrared induction module, a temperature-detecting module and a fan module. The mother board includes a baseboard management controller, and the first device module assembled close to a front side of the chassis is draw-able in a first direction. When the first device module is completely located within the chassis, the first device module is defined to be located in a first position, while any position of the first device module in the first direction other than the first position is defined as a second position.

The infrared induction module assembled close to the first device module and electrically coupled with the baseboard management controller is to detect the position of the first device module being comparatively to the chassis, to generate position information, and further to transmit the position information to the baseboard management controller.

The temperature-detecting module assembled on the first device module and electrically coupled with the baseboard management controller is to detect the temperature of the first device module and generate temperature information to be further transmitted to the baseboard management controller. The baseboard management controller for receiving the temperature information and the position information is to base on the temperature information and the position information to perform temperature control. The fan module is assembled close to a rear side of the chassis and is electrically coupled with the baseboard management controller.

When the first device module is disposed at the first position, the baseboard management controller controls the fan module to operate according to a first mode, and, when the first device module is disposed at the second position, the baseboard management controller controls the fan module to operate according to a second mode In one embodiment of the present invention, the chassis further includes a second device module draw-able assembled at the front side of the chassis in the first direction, the second device module being located between the first device module and the fan module closing to the first device module, both the first device module and the second device module being assembled to a bottom surface of the chassis.

In one embodiment of the present invention, the infrared induction module further includes an infrared-detecting unit and a signal-processing unit, the infrared-detecting unit detecting the position of the first device module and further transmitting a position-state signal standing for the first device module to the signal-processing unit, the signal-processing unit receiving the position-state signal and then processing and magnifying the position-state signal to the position information, and further transmitting the position information to the baseboard management controller.

In one embodiment of the present invention, the infrared-detecting unit further includes an infrared LED, an infrared photo diode, a connection plate and a blocking plate, and the first device module further includes a transmission mechanism, the connection plate being assembled in the chassis, the infrared LED and the infrared photo diode being both assembled at the side of the connection plate closing to the transmission mechanism, the blocking plate being assembled on the transmission mechanism. When the first device module is located at the first position, the blocking plate and the connection plate are parallel to each other, and the infrared LED is attached onto the infrared photo diode. When the first device module is located at the second position, the blocking plate is away from the infrared LED and the infrared photo diode.

In one embodiment of the present invention, the fan module further includes a plurality of fan units working with a fan speed. The first mode is that, when the first device module is located at the first position, the baseboard management controller controls a fan speed according to the temperature information and a first speed-control table. The second mode is that, when the first device module is located at the second position, the baseboard management controller controls the fan speed according to the temperature information and a second speed-control table.

In one embodiment of the present invention, the chassis further includes a front panel having a first alarm indicator and a second alarm indicator. When the first device module is located at the first position and the temperature information reaches the first critical temperature, the first alarm indicator lights up. When the first device module is located at the second position, the second alarm indicator lights up, and, further when the temperature information reaches the second critical temperature, the first alarm indicator lights up.

In one embodiment of the present invention, when the first device module is located at the first position, the infrared photo diode can not receive the infrared rays emitted from the infrared LED, and then the infrared-detecting unit stops but issues a low voltage-level position-state signal to the signal-processing unit; wherein, when the first device module is located at the second position, since spacing between the infrared LED and the blocking plate is formed, thus the infrared photo diode receives a reflected light of the infrared LED, and the infrared-detecting unit is activated to transmit a high voltage-level position-state signal to the signal-processing unit.

In one embodiment of the present invention, the signal-processing unit further includes a processing chip, a chip-enable control unit, a drive-control unit and an output-control unit. The chip-enable control unit is to transmit an enable signal to the processing chip so as to control the processing chip to work. The drive-control unit is to transmit a clock signal to the processing chip, and the processing chip processes the clock signal and then output a drive signal to the infrared-detecting unit so as further to drive the infrared-detecting unit to work. The processing chip is to receive the position-state signal, to transform the position-state signal, and then to output an output signal to the output-control unit. The output-control unit is to receive the output signal, to transform the output signal into a corresponding control signal comparatively to the baseboard management controller, and to transmit the control signal to the baseboard management controller.

In one embodiment of the present invention, the first device module is a hard disk module having a hard-disk cage, a plurality of hard disks and a hard-disk back plate. The plurality of hard disks is assembled in the hard-disk cage and electrically coupled with the hard-disk back plate. The hard-disk rack is connected to one end of the transmission mechanism while another end of the transmission mechanism is movably assembled to the chassis. The temperature-detecting module is assembled onto the hard-disk back plate.

In one embodiment of the present invention, the first device module is a mainframe module, the mother board is assembled on the mainframe module, and the mainframe module is connected to one end of the transmission mechanism while another end of the transmission mechanism is movably assembled to the chassis. Further, the temperature-detecting module is a temperature sensor, and the first direction is from a rear side of the chassis to the front side of the chassis.

In the present invention, the method for controlling a temperature of a computer includes the steps of: assembling at least one first device module in a first direction and in a draw-able manner at a front side of a chassis, wherein a position of the first device module is defined as a first position when the first device module is completely located within the chassis, wherein any position of the first device in the first direction other than the first position is further defined as a second position; applying an infrared induction module to detect a position of the first device module comparatively to the chassis and further to generate position information to be transmitted to a baseboard management controller; applying a temperature-detecting module to detect a temperature of the first device module, to generate temperature information, and then to transmit the temperature information to the baseboard management controller; and, applying the baseboard management controller to receive the temperature information and the position information and basing on the temperature information and the position information to perform temperature control. When the first device module is disposed at a first position, the baseboard management controller controls the fan module to operate according to a first mode, and, when the first device module is disposed at a second position, the baseboard management controller controls the fan module to operate according to a second mode.

In one embodiment of the present invention, a second device module is draw-able assembled at the front side of the chassis in the first direction, the second device module being assembled between the first device module and the fan module closing to the first device module, both the first device module and the second device module being assembled to a bottom surface of the chassis.

In one embodiment of the present invention, the infrared induction module further includes an infrared-detecting unit and a signal-processing unit, the infrared-detecting unit detecting a position of the first device module and transmitting a position-state signal standing for the first device module to the signal-processing unit, the signal-processing unit receiving the position-state signal and then processing and magnifying the position-state signal, the position-state signal being further transmitted to the baseboard management controller.

In one embodiment of the present invention, the infrared-detecting unit further includes an infrared LED, an infrared photo diode, a connection plate and a blocking plate, and the first device module further includes a transmission mechanism, the connection plate being assembled in the chassis, the infrared LED and the infrared photo diode being both assembled at the side of the connection plate closing to the transmission mechanism, the blocking plate being assembled on the transmission mechanism. When the first device module is located at the first position, the blocking plate and the connection plate are parallel to each other, and the infrared LED is attached onto the infrared photo diode. When the first device module is located at the second position, the blocking plate is away from the infrared LED and the infrared photo diode.

In one embodiment of the present invention, the fan module further includes a plurality of fan units with a fan speed. The first mode is that, when the first device module is located at the first position, the baseboard management controller controls the fan speed according to the temperature information and a first speed-control table. The second mode is that, when the first device module is located at the second position, the baseboard management controller controls the fan speed according to the temperature information and a second speed-control table.

In one embodiment of the present invention, the chassis further includes a front panel having a first alarm indicator and a second alarm indicator. When the first device module is located at the first position and the temperature information reaches the first critical temperature, the first alarm indicator lights up. When the first device module is located at the second position, the second alarm indicator lights up, and, further when the temperature information reaches the second critical temperature, the first alarm indicator lights up.

In one embodiment of the present invention, when the first device module is located at the first position, the infrared photo diode can't receive the infrared rays emitted from the infrared LED, and then the infrared-detecting unit stops but issues a low voltage-level position-state signal to the signal-processing unit; wherein, when the first device module is located at the second position, since spacing between the infrared LED and the blocking plate is formed, thus the infrared photo diode receives a reflected light of the infrared LED, and the infrared-detecting unit is activated to transmit a high voltage-level position-state signal to the signal-processing unit.

In one embodiment of the present invention, the signal-processing unit further includes a processing chip, a chip-enable control unit, a drive-control unit and an output-control unit. The chip-enable control unit is to transmit an enable signal to the processing chip so as to control the processing chip to work. The drive-control unit is to transmit a clock signal to the processing chip, the processing chip processes the clock signal, outputs an drive signal to the infrared-detecting unit, and then drives the infrared-detecting unit to work. The processing chip is to receive the position-state signal, to transform the position-state signal, and then to output an output signal to the output-control unit. The output-control unit is to receive the output signal, to transform the output signal into a corresponding control signal comparatively to the baseboard management controller, and to transmit the control signal to the baseboard management controller.

In one embodiment of the present invention, the first device module is a hard disk module having a hard-disk cage, a plurality of hard disks and a hard-disk back plate. The plurality of hard disks is fixed by the hard-disk cage and electrically coupled with the hard-disk back plate. The hard-disk cage is connected to one end of the transmission mechanism while another end of the transmission mechanism is movably assembled to the chassis. The temperature-detecting module is assembled onto the hard-disk back plate.

In one embodiment of the present invention, the first device module is a mainframe module, and the mother board is assembled on the mainframe module, the mainframe module is connected to one end of the transmission mechanism while another end of the transmission mechanism is movably assembled to the chassis. Further, the temperature-detecting module is a temperature sensor, and the first direction is from a rear side of the chassis to the front side of the chassis.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a system and a method for controlling temperatures of a computer. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

The primary object of the present invention is to provide a system and a method for controlling temperatures of a computer that introduce an infrared induction module and a temperature-detecting module to probe position information and temperature information of the device module, respectively, so as further to have a baseboard management controller to analyze and judge the obtained information. Hence, the device module can be controlled relevantly according to various operation statuses and temperature conditions, such that better temperature control for the device module can be significantly improved. Also, the operation temperature of the device module can be maintained lower than a predetermined temperature so as to ensure normal operation of the device module and to greatly increase the efficiency of test, maintenance and repair.

Figure 1:
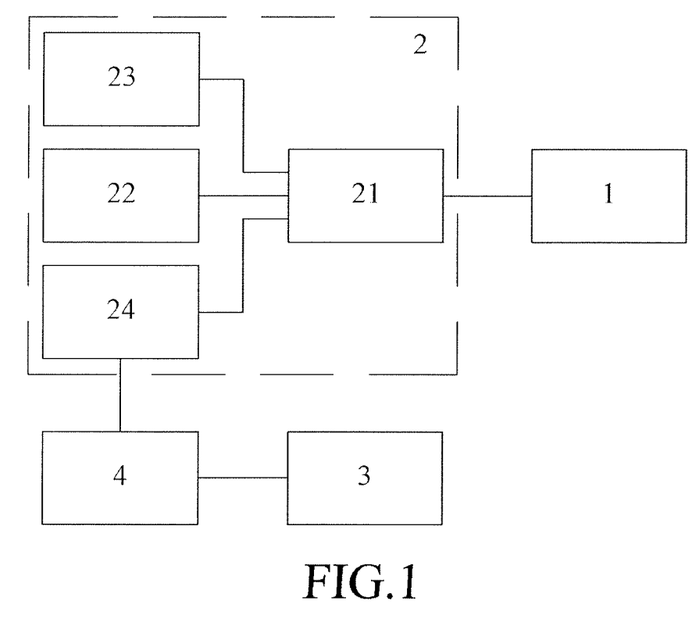
FIG. 1 is a block view of the preferred system for controlling temperatures of a computer.
Figure 2:
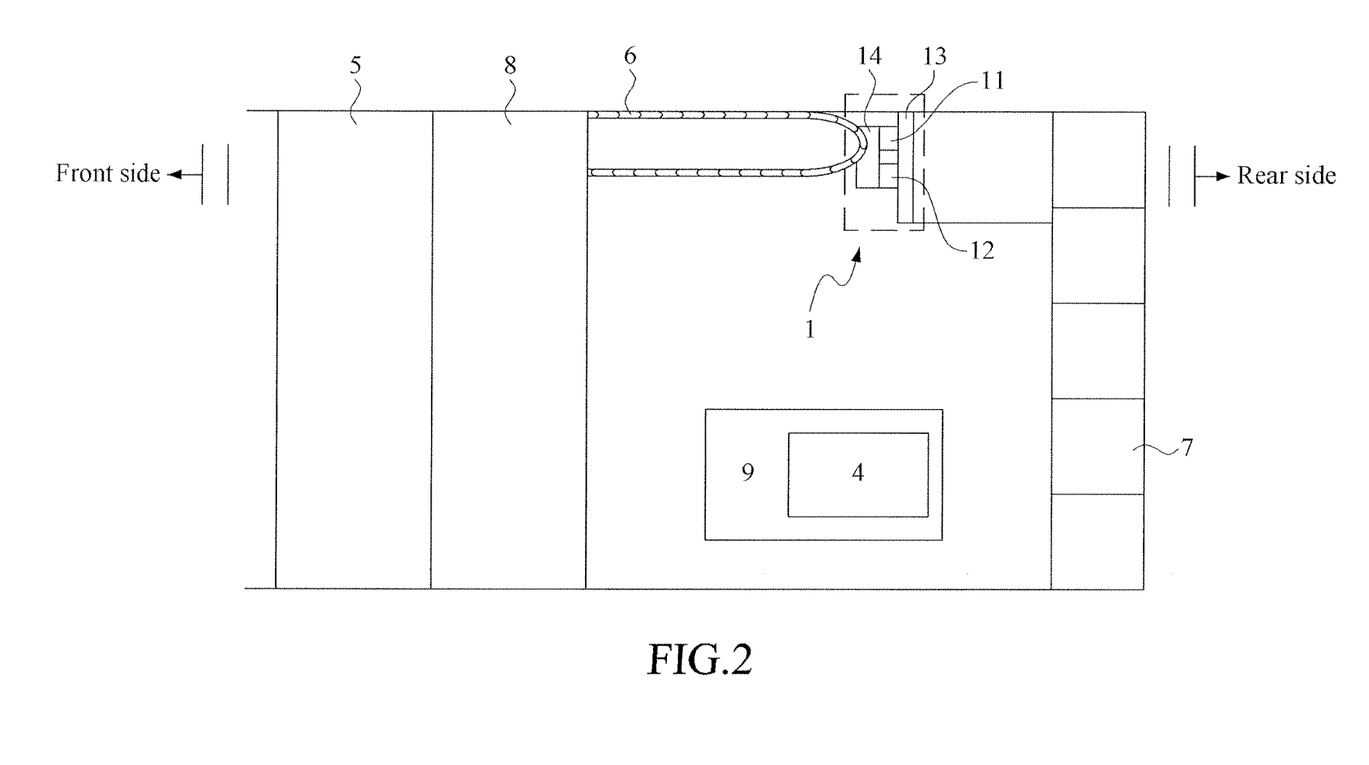
FIG. 2 is a schematic view of internal structures of the chassis of FIG. 1.
Figure 3:
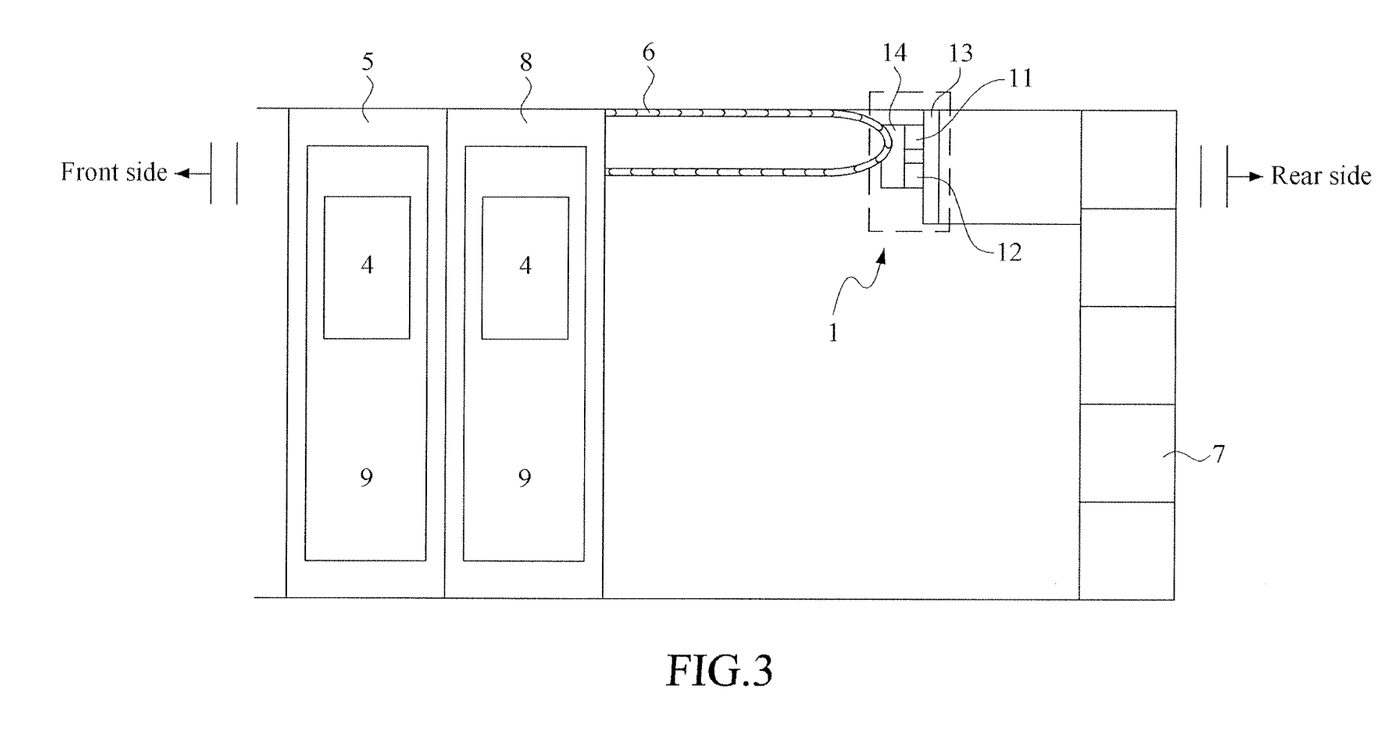
FIG. 3 is a schematic view of internal structures of another embodiment of the chassis of the system for controlling temperatures of a computer.
Figure 4:
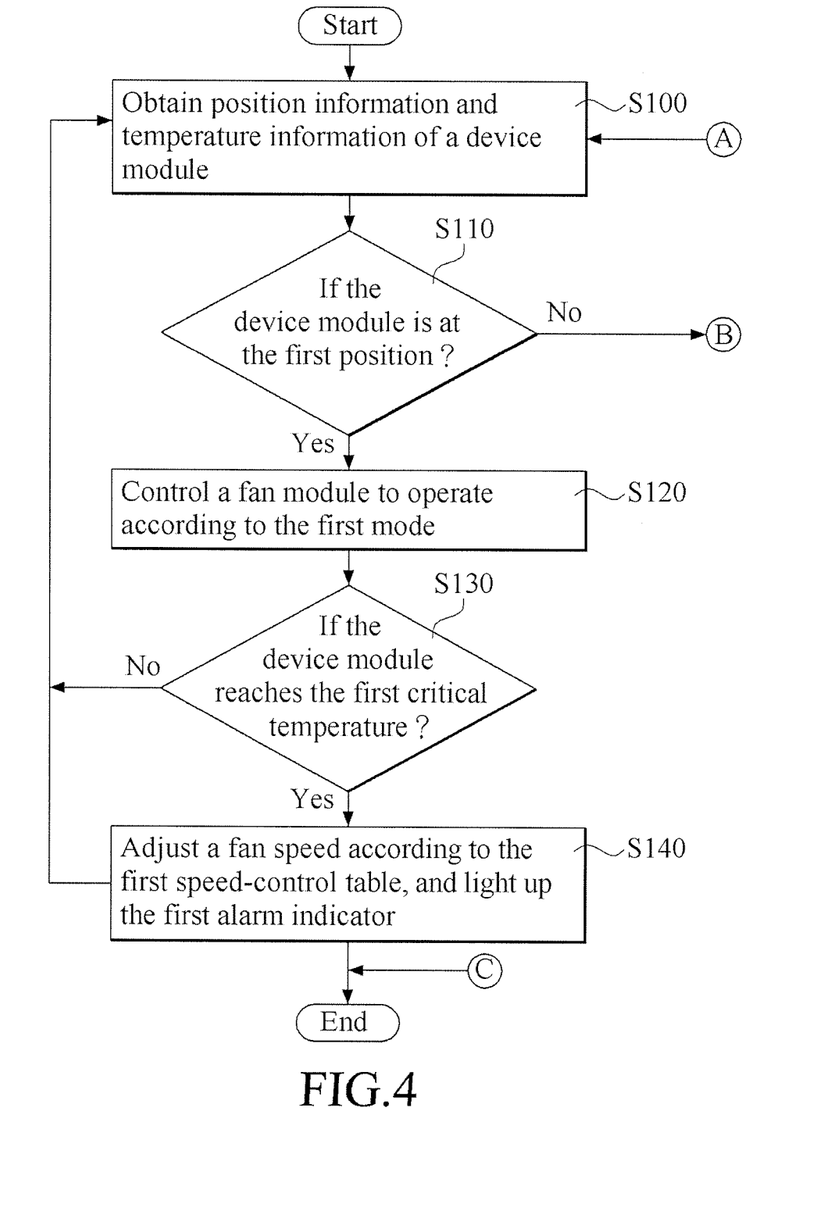
FIG. 4 and FIG. 4A are both continuously to demonstrate a complete flowchart of the preferred method for controlling temperatures of a computer.
Figure 4A:
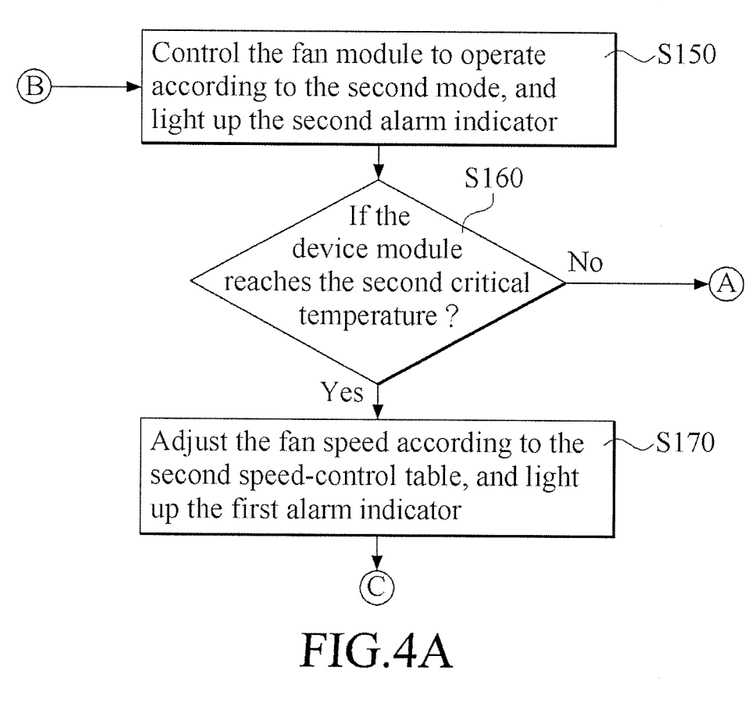

Refer now to FIG. 1 through FIG. 4A, where FIG. 1 is a block view of the preferred system for controlling temperatures of a computer in accordance with the present invention, FIG. 2 is a schematic view of internal structures of the chassis of FIG. 1, FIG. 3 is a schematic view of internal structures of another embodiment of the chassis of the system for controlling temperatures of a computer in accordance with the present invention, and FIG. 4 associated FIG. 4A are a flowchart of the preferred method for controlling temperatures of a computer in accordance with the present invention.

The preferred system for controlling temperatures of a computer includes a chassis further including thereinside a mother board 9, a first device module 5, an infrared induction module, a temperature-detecting module 3 and a fan module. The mother board 9 includes a baseboard management controller 4. The first device module 5 assembled close to a front side of the chassis is draw-able in a first direction. In this description, the first device module 5 is defined to occupy one of at least one first position inside the chassis, and the rest of the positions inside the chassis are defined as the second positions. The infrared induction module, assembled close to the first device module 5 and electrically coupled with the baseboard management controller 4, is to detect the position of the first device module 5 comparatively to the chassis, to generate position information, and further to transmit the position information to the baseboard management controller 4. The temperature-detecting module 3, assembled on the first device module 5 and electrically coupled with the baseboard management controller 4, is to detect the temperature of the first device module 5, to generate temperature information, and then to transmit to the baseboard management controller 4. The baseboard management controller 4 for receiving the temperature information and the position information is to base on the temperature information and the position information to perform the temperature control. The fan module is assembled close to the rear side of the chassis and is electrically coupled with the baseboard management controller 4. In the case that the first device module is disposed at the first position, the baseboard management controller 4 would control the fan module to operate according to the first mode. On the other hand, in the case that the first device module is disposed at the second position, the baseboard management controller 4 would control the fan module to operate according to the second mode.

In the present invention, the temperature control method for the aforesaid system includes a step of assembling at least one first device module 5 in the first direction and in a draw-able manner at a front side of a chassis, a step of defining positions of all of the at least one first device module 5 in the chassis as the first positions and the rest of positions in the chassis as the second positions, a step of applying an infrared induction module to detect a position of the first device module 5 comparatively to the chassis, to generate position information, and the to transmit to a baseboard management controller 4, a step of applying a temperature-detecting module 3 to detect a temperature of the first device module 5, to generate temperature information, and then to transmit the temperature information to the baseboard management controller 4, a step of the baseboard management controller 4 receiving the temperature information and the position information and basing on the temperature information and the position information to perform temperature control, a step of the baseboard management controller 4 controlling a fan module to operate at a first mode when the first device module 5 locates at the first position, and a step of the baseboard management controller 4 controlling the fan module to operate at a second mode when the first device module 5 locates at the second position.

In the present invention, both the system and the method for controlling temperatures of a computer introduce the infrared induction module and the temperature-detecting module 3, respectively, to detect position information and temperature information of the device module 5, and introduce the baseboard management controller 4 to analyze and judge the position and temperature information, such that the device module 5 can apply different control means to meet different operation statuses and temperature conditions. Hence, the temperature control upon the device module 5 can be significantly improved by having the operation temperature thereof to be always below the predetermined temperature, such that the device module 5 can be kept at a normal operation temperature and also the efficiency of test, maintenance and repair can be greatly increased.

Further, inside the chassis, a second device module 8 is draw-able assembled at the front side of the chassis in the first direction. Particularly, the second device module 8 is assembled between the first device module 5 and the fan module closing to the first device module 5. The first device module 5 and the second device module 8 are both assembled to a bottom surface of the chassis. Namely, while pulling the second device module 8 from the chassis, the first device module 5 shall be pulled off the chassis in advance. Thus, monitoring positions of the first device module 5 can be enough to enable the temperature control by the computer. The existence of the second device module 8 can upgrade and make versatile functions of the system for controlling temperatures of a computer.

Further, the infrared induction module includes an infrared-detecting unit 1 and a signal-processing unit 2. The infrared-detecting unit 1 is to detect the position of the first device module 5 and to further transmit a position-state signal standing for the first device module 5 to the signal-processing unit 2. The signal-processing unit 2 receives the position-state signal, and then the position-state signal is processed and magnified before being transmitted to the baseboard management controller 4.

In the embodiment of the present invention, as shown in FIG. 2, the infrared-detecting unit 1 includes an infrared LED 11, an infrared photo diode 12, a connection plate 13 and a blocking plate 14. The first device module 5 further includes a transmission mechanism 6. The connection plate 13 is assembled in the chassis. The infrared LED 11 and the infrared photo diode 12 are both assembled at the side of the connection plate 13 closing to the transmission mechanism 6. The blocking plate 14 is assembled on the transmission mechanism 6. When the first device module 5 is located at the first position, the blocking plate 14 and the connection plate 13 are parallel to each other, and the infrared LED 11 is attached onto the infrared photo diode 12. When the first device module 5 is located at the second position, the blocking plate 14 is away from the infrared LED 11 and the infrared photo diode 12.

When the first device module 5 is located at the first position, the infrared photo diode 12 can not receive the infrared rays emitted from the infrared LED 11, and then the infrared-detecting unit 1 stops and issues a low voltage-level position-state signal to the signal-processing unit 2. When the first device module 5 is located at the second position, since spacing between the infrared LED 11 and the blocking plate 14 is formed, thus the infrared photo diode 12 would receive a reflected light of the infrared LED 11. At this time, the infrared-detecting unit 1 is activated to transmit a high voltage-level position-state signal to the signal-processing unit 2.

Further, the fan module includes a plurality of fan units 7 with a fan speed. When the first device module 5 is located at the first position, the first mode is that the baseboard management controller 4 adjusts the fan speed according to the temperature information and first speed-control tables. When the first device module 5 is located at the second position, the second mode is that the baseboard management controller 4 adjusts the fan speed according to the temperature information and second speed-control tables. The first and the second speed-control tables include relationships of the temperature information, the position information and the fan speed.

Further, the chassis includes a front panel, and the front panel includes a first alarm indicator and a second alarm indicator. When the first device module 5 is located at the first position and the temperature information shows that the temperature has reached a first critical temperature, then the first alarm indicator lights up. When the first device module 5 is located at the second position and the temperature information shows that the temperature has reached a second critical temperature, then the second alarm indicator lights up.

In the preferred embodiment, as shown in FIG. 1, the signal-processing unit 2 includes a processing chip 21 (for example, an APDS-9700 chip), a chip-enable control unit 22, a drive-control unit 23 and an output-control unit 24. The chip-enable control unit 22 is used to send an enable signal to the processing chip 21 so as to control the processing chip 21 to enter a work state. The drive-control unit 23 is used to send a clock signal to the processing chip 21. The processing chip 21 processes the clock signal, outputs a drive signal to the infrared-detecting unit 1, and then drives the infrared-detecting unit 1 to work. The processing chip 21 for receiving the position-state signal is to output an output signal to the output-control unit 24 after the position-state signal is transformed. The output-control unit 24 for receiving the output signal is to transform the output signal in to a control signal in correspondence with the baseboard management controller, and then the control signal is transmitted to the baseboard management controller 4.

In this preferred embodiment, the first device module 5 and/or the second device module 8 can be a hard disk module having a hard-disk cage, a plurality of hard disks and a hard-disk back plate. The plurality of the hard disks are fixed by the hard-disk cage and electrically coupled with the hard-disk back plate. The hard-disk cage is connected to one end of the transmission mechanism 6, while another end of the transmission mechanism 6 is assembled to the chassis in a movable manner. The temperature-detecting module 3 is assembled on the hard-disk back plate. Preferably, the temperature-detecting module 3 can be a temperature sensor, such as a thermistor temperature sensor, and can be mounted to the back plate in a draw-able manner with the back plate with respect to the chassis. Upon such an arrangement, measurement precision can be ensured. In this present invention, the first direction is defined as the direction from the rear side of the chassis to the front side of the chassis.

As shown in FIG. 4 and FIG. 4A, after the baseboard management controller 4 receives the position information and the temperature information (Step S100), by judging the position information and the temperature information of the device module 5, the temperature control means is determined according to the position of the device module 5. Upon determining whether or not the device module 5 is at the first position (Step S110), in the case that the device module 5 is located in position inside the chassis (i.e. the first position), then the baseboard management controller 4 control the fan module 7 to operate according to the first mode (Step S120).

Further, the first mode includes: a step (Step S130) of determining if the device module 5 reaches the first critical temperature as the device module 5 is located at the first position, and a step (Step S140) of the baseboard management controller 4 adjusting a fan speed according to the first speed-control table and lighting up the first alarm indicator as the temperature information tells that the temperature of the device module 5 reaches the first critical temperature. Then, go back to Step S110. In the case that the device module 5 is pulled away the chassis, the judgment of S110 would tell that the device module 5 is not at the first position, i.e. at the second position. Then, the baseboard management controller 4 would operate the fan module 7 to operate according to the second mode, and to light up the second alarm indicator (Step S150). The second mode includes: a step (Step S160) of determining if the device module 5 reaches the second critical temperature, and a step (Step S170) of the baseboard management controller 4 adjusting the fan speed according to the second first speed-control table and lighting up the first alarm indicator as the temperature information tells that the temperature of the device module 5 reaches the second critical temperature. Also, the first alarm indicator lights up.

Further, in the present invention, the second critical temperature is smaller than the first critical temperature. In the case that the same temperature is met, the fan speed for the second position would be larger than that for the first position. While the device module 5 is away from its working position and meets a severe cold environment, the alarm indicators would also alert the corresponding personals that the device module 5 operates abnormally and might need helps.

As shown in FIG. 3, the second embodiment of the system for controlling temperatures of a computer presents differences to the aforesaid first embodiment by having the following features. In this embodiment, the first device module 5 and/or the second device module 8 is a mainframe module, the mother board 9 is assembled on the mainframe module, and the mainframe module is connected to one end of the transmission mechanism 6 while another end thereof is assembled to the chassis in a movable manner. It can be understood that the first device module 5 and the second device module 8 can be different modules, such as a hard disk module for the device module 5 and a mainframe module for the second device module 8, so that the system for controlling temperatures of a computer can provide different services.

While the present invention has been particularly shown and described with reference to a preferred embodiment, it will be understood by those skilled in the art that various changes in form and detail may be without departing from the spirit and scope of the present invention.

What is claimed is:

1. A system for controlling temperatures of a computer, comprising:
    a chassis;
    a mother board assembled inside the chassis and including a baseboard management controller;
    a first device module assembled close to a front side of the chassis, being draw-able in a first direction; wherein, when the first device module is completely located within the chassis, the first device module is defined to be located in a first position, and any position of the first device module in the first direction other than the first position is defined as a second position;
    an infrared induction module assembled close to the first device module and electrically coupled with the baseboard management controller, detecting a position of the first device module comparatively to the chassis, generating a position information, and further transmitting the position information to the baseboard management controller;
    a temperature-detecting module assembled on the first device module and electrically coupled with the baseboard management controller, detecting a temperature of the first device module, generating a temperature information, and further transmitting to the baseboard management controller; and
    a fan module assembled close to a rear side of the chassis and electrically coupled with the baseboard management controller;
    wherein the baseboard management controller receives the temperature information and the position information to accordingly perform temperature control;
    wherein, when the first device module is disposed at the first position, the baseboard management controller controls the fan module to operate according to a first mode, and when the first device module is disposed at the second position, the baseboard management controller controls the fan module to operate according to a second mode;
    wherein the infrared induction module further includes an infrared-detecting unit and a signal-processing unit, the infrared-detecting unit detecting the position of the first device module and further transmitting a position-state signal standing for the first device module to the signal-processing unit, the signal-processing unit receiving the position-state signal and then processing and magnifying the position-state signal to the position information, and further transmitting the position information to the baseboard management controller;
    wherein the infrared-detecting unit further includes an infrared LED, an infrared photo diode, a connection plate and a blocking plate, and the first device module further includes a transmission mechanism, the connection plate being assembled in the chassis, the infrared LED and the infrared photo diode being both assembled at the side of the connection plate closing to the transmission mechanism, the blocking plate being assembled on the transmission mechanism;
    wherein, when the first device module is located at the first position, the blocking plate and the connection plate are parallel to each other, and the infrared LED is attached onto the infrared photo diode; and wherein, when the first device module is located at the second position, the blocking plate is away from the infrared LED and the infrared photo diode.

2. The system for controlling temperatures of a computer of claim 1, wherein the chassis further includes a second device module draw-able assembled at the front side of the chassis in the first direction, the second device module being located between the first device module and the fan module closing to the first device module, both the first device module and the second device module being assembled to a bottom surface of the chassis.

3. The system for controlling temperatures of a computer of claim 1, wherein the fan module further includes a plurality of fan units working with a fan speed;
wherein the first mode is that, when the first device module is located at the first position, the baseboard management controller controls the fan speed according to the temperature information and a first speed-control table;
wherein the second mode is that, when the first device module is located at the second position, the baseboard management controller controls the fan speed according to the temperature information and a second speed-control table.

4. The system for controlling temperatures of a computer of claim 1, wherein the chassis further includes a front panel having a first alarm indicator and a second alarm indicator;
wherein, when the first device module is located at the first position and the temperature information reaches the first critical temperature, the first alarm indicator lights up;
wherein, when the first device module is located at the second position, the second alarm indicator lights up, and, further when the temperature information reaches the second critical temperature, the first alarm indicator lights up.

5. The system for controlling temperatures of a computer of claim 1, wherein, when the first device module is located at the first position, the infrared photo diode can not receive the infrared rays emitted from the infrared LED, and then the infrared-detecting unit stops but issues a low voltage-level position-state signal to the signal-processing unit; wherein, when the first device module is located at the second position, since spacing between the infrared LED and the blocking plate is formed, thus the infrared photo diode receives a reflected light of the infrared LED, and the infrared-detecting unit is activated to transmit a high voltage-level position-state signal to the signal-processing unit.

6. The system for controlling temperatures of a computer of claim 1, wherein the signal-processing unit further includes:
a processing chip receiving the position-state signal, transforming the position-state signal, and then outputting an output signal;
a chip-enable control unit transmitting an enable signal to the processing chip so as to control the processing chip to work;
a drive-control unit transmitting a clock signal to the processing chip for processing the clock signal, outputting an drive signal to the infrared-detecting unit, and then driving the infrared-detecting unit to work; and
an output-control unit receiving the output signal, transforming the output signal into a corresponding control signal with respect to the baseboard management controller, and then transmitting the control signal to the baseboard management controller.

7. The system for controlling temperatures of a computer of claim 1, wherein the first device module is a hard disk module having:
a hard-disk cage, connected to one end of the transmission mechanism while another end of the transmission mechanism is movably assembled to the chassis;
a hard-disk back plate, with the temperature-detecting module assembled thereon; and
a plurality of hard disks, assembled in the hard-disk cage and electrically coupled with the hard-disk back plate.

8. The system for controlling temperatures of a computer of claim 1, wherein the first device module is a mainframe module, the mother board is assembled on the mother board module, the mainframe module is connected to one end of the transmission mechanism while another end of the transmission mechanism is movably assembled to the chassis.

9. A method for controlling a temperature of a computer, comprising the steps of:
assembling at least one first device module in a first direction and in a draw-able manner at a front side of a chassis, defining a position of the first device module as a first position when the first device module is completely located within the chassis, and further defining any position of the first device in the first direction other than the first position as a second position;
detecting a position of the first device module comparatively to the chassis by an infrared induction module, generating a position information, and then transmitting the position information to a baseboard management controller;
detecting a temperature of the first device module by a temperature-detecting module, generating a temperature information, and transmitting the temperature information to the baseboard management controller; and
the baseboard management controller receiving the temperature information and the position information and performing temperature control based on the temperature information and the position information;
wherein, when the first device module is disposed at the first position, the baseboard management controller controls the fan module to operate according to a first mode, and, when the first device module is disposed at the second position, the baseboard management controller controls the fan module to operate according to a second mode;
wherein the infrared induction module further includes an infrared-detecting unit and a signal-processing unit, the infrared-detecting unit being to detect a position of the first device module and to further transmit a position-state signal standing for the first device module to the signal-processing unit, the signal-processing unit receiving the position-state signal and then processing and magnifying the position-state signal, the position-state signal being further transmitted to the baseboard management controller;
wherein, the infrared-detecting unit further includes an infrared LED, an infrared photo diode, a connection plate and a blocking plate, and the first device module further includes a transmission mechanism, the connection plate being assembled in the chassis, the infrared LED and the infrared photo diode being both assembled at the side of the connection plate closing to the transmission mechanism, the blocking plate being assembled on the transmission mechanism;

wherein, when the first device module is located at the first position, the blocking plate and the connection plate are parallel to each other, and the infrared LED is attached onto the infrared photo diode; and wherein, when the first device module is located at the second position, the blocking plate is away from the infrared LED and the infrared photo diode.

10. The method for controlling a temperature of a computer of claim 9, wherein a second device module is drawable assembled at the front side of the chassis in the first direction, the second device module being assembled between the first device module and the fan module closing to the first device module, both the first device module and the second device module being assembled to a bottom surface of the chassis.

11. The method for controlling a temperature of a computer of claim 9, wherein the fan module further includes a plurality of fan units working with a fan speed;

wherein the first mode is that, when the first device module is located at the first position, the baseboard management controller controls the fan speed according to the temperature information and a first speed-control table;

wherein the second mode is that, when the first device module is located at the second position, the baseboard management controller controls the fan speed according to the temperature information and a second speed-control table.

12. The method for controlling a temperature of a computer of claim 9, wherein the chassis further includes a front panel having a first alarm indicator and a second alarm indicator;

wherein, when the first device module is located at the first position and the temperature information reaches the first critical temperature, the first alarm indicator lights up;

wherein, when the first device module is located at the second position, the second alarm indicator lights up, and, further when the temperature information reaches the second critical temperature, the first alarm indicator lights up.

13. The method for controlling a temperature of a computer of claim 9, wherein, when the first device module is located at the first position, the infrared photo diode can not receive the infrared rays emitted from the infrared LED, and then the infrared-detecting unit stops but issues a low voltage-level position-state signal to the signal-processing unit; wherein, when the first device module is located at the second position, since spacing between the infrared LED and the blocking plate is formed, thus the infrared photo diode receives a reflected light of the infrared LED, and the infrared-detecting unit is activated to transmit a high voltage-level position-state signal to the signal-processing unit.

14. The method for controlling a temperature of a computer of claim 9, wherein the signal-processing unit further includes:

a processing chip, receiving the position-state signal, transforming the position-state signal, and then outputting an output signal to an output-control unit;

a chip-enable control unit, transmitting an enable signal to the processing chip so as to control the processing chip to work;

a drive-control unit, transmitting a clock signal to the processing chip for processing the clock signal, outputting an drive signal to the infrared-detecting unit, and then driving the infrared-detecting unit to work; and the output-control unit, receiving the output signal, transforming the output signal into a corresponding control signal with respect to the baseboard management controller, and then transmitting the control signal to the baseboard management controller.

15. The method for controlling a temperature of a computer of claim 9, wherein the first device module is a hard disk module having:

a hard-disk cage, connected to one end of the transmission mechanism while another end of the transmission mechanism is movably assembled to the chassis;

a hard-disk back plate, with the temperature-detecting module assembled thereon; and a plurality of hard disks, assembled in the hard-disk cage and electrically coupled with the hard-disk back plate.

16. The method for controlling a temperature of a computer of claim 9, wherein the first device module is a mainframe module, the mother board is assembled on the mainframe module, the mainframe module is connected to one end of the transmission mechanism while another end of the transmission mechanism is movably assembled to the chassis.

* * * * *